United States Patent
Liu et al.

(10) Patent No.: US 12,393,129 B2
(45) Date of Patent: *Aug. 19, 2025

(54) METHOD AND DEVICE FOR CLEANING SUBSTRATES

(71) Applicant: Taiwan Semiconductor Manufacturing Company, Ltd., Hsinchu (TW)

(72) Inventors: Chung-Hsuan Liu, Taichung (TW); Chen-Yang Lin, Zhudong Township (TW); Ku-Hsiang Sung, Taoyuan (TW); Da-Wei Yu, Hsinchu (TW); Kuan-Wen Lin, Taichung (TW); Chia-Jen Chen, Jhudong Township (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/671,174

(22) Filed: May 22, 2024

(65) Prior Publication Data

US 2024/0310744 A1 Sep. 19, 2024

Related U.S. Application Data

(63) Continuation of application No. 17/367,835, filed on Jul. 6, 2021, now Pat. No. 12,032,302.

(Continued)

(51) Int. Cl.
*G03F 7/00* (2006.01)
*B08B 7/00* (2006.01)
(Continued)

(52) U.S. Cl.
CPC ........ *G03F 7/70925* (2013.01); *B08B 7/0035* (2013.01); *B08B 13/00* (2013.01);
(Continued)

(58) Field of Classification Search
None
See application file for complete search history.

(56) References Cited

U.S. PATENT DOCUMENTS

| 7,628,865 B2 | 12/2009 | Singh |
| 7,959,970 B2 | 6/2011 | Gaudet et al. |

(Continued)

FOREIGN PATENT DOCUMENTS

| TW | I291997 B | 1/2008 |
| TW | I364630 B | 5/2012 |

(Continued)

OTHER PUBLICATIONS

Non-Final Office Action issued in U.S. Appl. No. 17/367,835, dated Nov. 1, 2023.

(Continued)

*Primary Examiner* — Sarah K Salerno
(74) *Attorney, Agent, or Firm* — STUDEBAKER BRACKETT PLLC

(57) ABSTRACT

In a method of manufacturing a semiconductor device a semiconductor wafer is retrieved from a load port. The semiconductor wafer is transferred to a treatment device. In the treatment device, the surface of the semiconductor wafer is exposed to a directional stream of plasma wind to clean a particle from the surface of the semiconductor wafer. The stream of plasma wind is generated by an ambient plasma generator and is directed at an oblique angle with respect to a perpendicular plane to the surface of the semiconductor (Continued)

wafer for a predetermined plasma exposure time. After the cleaning, a photo resist layer is disposed on the semiconductor wafer.

20 Claims, 13 Drawing Sheets

Related U.S. Application Data

(60) Provisional application No. 63/166,893, filed on Mar. 26, 2021.

(51) Int. Cl.
 *B08B 13/00* (2006.01)
 *H01L 21/02* (2006.01)
 *H01L 21/66* (2006.01)
 *H05H 1/00* (2006.01)

(52) U.S. Cl.
 CPC ........ *H01L 21/02057* (2013.01); *H01L 22/12* (2013.01); *H05H 1/01* (2021.05)

(56) References Cited

U.S. PATENT DOCUMENTS

| | | |
|---|---|---|
| 9,209,010 B2 | 12/2015 | Matsui et al. |
| 12,032,302 B2* | 7/2024 | Liu .................... B08B 13/00 |
| 2012/0279519 A1 | 11/2012 | Swanson et al. |
| 2013/0306101 A1* | 11/2013 | Swanson ............ B08B 7/04 |
| | | 156/345.43 |
| 2014/0014138 A1* | 1/2014 | Spiegelman ........ B08B 3/10 |
| | | 134/31 |
| 2015/0129131 A1 | 5/2015 | Li et al. |

FOREIGN PATENT DOCUMENTS

| | | |
|---|---|---|
| TW | 201249551 A | 12/2012 |
| TW | I514451 B | 12/2015 |

OTHER PUBLICATIONS

Notice of Allowance issued in U.S. Appl. No. 17/367,835, dated Feb. 22, 2024.

* cited by examiner

METHOD AND DEVICE FOR CLEANING SUBSTRATES

PRIORITY CLAIM AND CROSS-REFERENCE

This application is a Continuation of U.S. application Ser. No. 17/367,835, filed on Jul. 6, 2021, which claims priority to U.S. Provisional Application No. 63/166,893, filed on Mar. 26, 2021, the entire disclosures of which are incorporated herein by reference.

BACKGROUND

During an integrated circuit (IC) design, a number of patterns of the IC, for different steps of IC processing, are generated on a substrate. The patterns may be produced by projecting, e.g., imaging, layout patterns of a mask on a photo resist layer of the wafer. A lithographic process transfers the layout patterns of the masks to the photo resist layer of the wafer such that etching, implantation, or other steps are applied only to predefined regions of the wafer. In order to transfers the layout patterns of the masks to the photo resist layer, it is desirable to have a mask that does not have particles or residues attached onto the surface of the mask and in a lithography operation, layout patterns of the mask are sharply and clearly imaged onto the wafer. In addition, it is desirable that the wafers do not have particles or residues attached onto the surface of the wafer and in the lithography operation, a photo resist layer may uniformly be distributed on the entire surface of the wafer.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
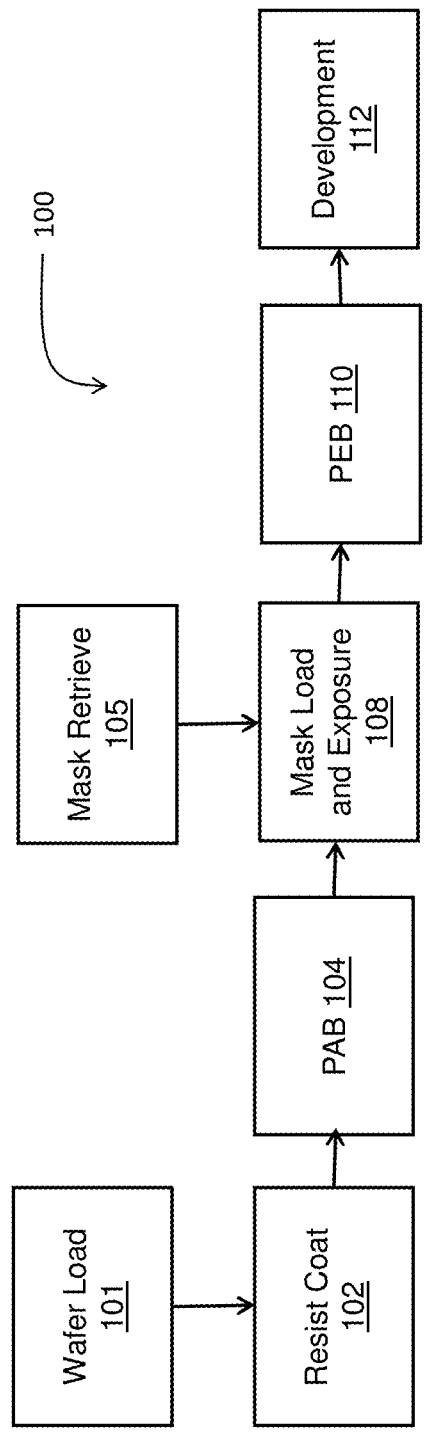
FIG. 1 shows a process flow for generating a photo resist pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the reticles are stored in the reticle library and the reticle library is maintained under vacuum condition to prevent the deposition of particles and hydrocarbon contamination on the reticles. However, when the reticle is used during a lithographic process, particles and hydrocarbon contamination may build up on the reticles. The particles and hydrocarbon contamination on the reticle may damage critical dimension (CD) uniformity in the pattern produced in the photo resist layer of a wafer. In some embodiments, the reticle surfaces are cleaned from particles and hydrocarbon contamination with solvents after the reticle is retrieved from the reticle library. In some embodiments, the reticle surfaces are cleaned from particles and hydrocarbon contamination with solvents before the reticle is stored in the reticle library. Cleaning the reticles with solvents, may introduce other particles in the reticle library if the reticles is cleaned before being stored. Cleaning the reticles with solvents, may introduce other particles in the exposure device of the lithographic system if the reticle is cleaned after being retrieved from the reticle library. In addition, cleaning the reticle with solvents may introduce a long delay in the lithographic process. In addition, in some embodiments, particles are disposed during the transportation or processing of the wafer and the particles on the wafer may additionally cause non-uniformity in the critical dimension (CD) of the photo resist pattern on the wafer. Therefore, it is desirable to clean the reticles and/or the wafers before performing the lithographic process.

In some embodiments, the lithographic system includes a treatment device in addition to the exposure device. The exposure device is used for projecting the layout patterns of the reticles on a photo resist layer of the wafer to pattern the wafer. The treatment device having a plasma generator may be used for cleaning the surface of the reticle or the wafer. In some embodiments, a plasma wind is produced by the plasma generator and the impact of the plasma wind to the surface of the reticle or the wafer is used to decompose the particles or hydrocarbon contamination deposited on the surface of the reticle or the wafer. In addition, the more the surface of the reticle or the wafer is irradiated by the plasma wind, the more the particles and the hydrocarbon contamination is decomposed, however, extra cleaning after the particles and the hydrocarbon contamination is removed causes delay. Thus, it is desirable to irradiate the surface of the reticle or the wafer to get an optimum improvement in CD uniformity (CDU) and avoid delay.

In some embodiments, the treatment device incudes a plasma generator that generates ambient plasma and the ambient plasma is directed through an opening of the plasma generator as a plasma wind with an oblique angle, e.g., a directional stream of plasma wind. Impacting a particle on a wafer or on a reticle by the plasma wind disintegrates the particles. The oblique angle of the plasma wind causes the disintegrated parts of the particle to get a velocity parallel to the surface of the reticle or wafer because of the impact. In some embodiments, the parallel velocity of the disintegrated parts causes the disintegrated parts to be thrown out of the surface of the reticle or the wafer. In some embodiments, the parallel speed of the disintegrated parts is determined by the size of the opening of the of the plasma generator and the plasma wind angle such that smaller opening and greater angle (with respect to a perpendicular surface to the surface of the reticle or wafer) provides higher speed for the plasma wind that better cleans the surface and pushes the disintegrated parts to be removed from the surface of the reticle or wafer. In plasma wind, the gas atoms are excited at higher energy states or are ionized. In some embodiments, when the excited gas atoms return to the normal energy state, ultraviolet (UV) light may be released. The mixture of the plasma ion impact and the UV light interacts, e.g., physically interacts, with the particles and removes the particles. In some embodiments, the larger the particle, the plasma is directed for the larger time to remove the particle. In some embodiments, the particles that are disposed on the wafer or reticle during transportation or processing are "fall-on" particles. In some embodiments, wet cleaning the surface of the wafers or reticles cause the fall-on particles to disintegrate and produce a number of smaller particles on the surface of the wafer or reticle and, thus, the wet cleaning and inspecting is repeated until all the particles are removed or the number of particles are within a threshold range.

Figure 4:
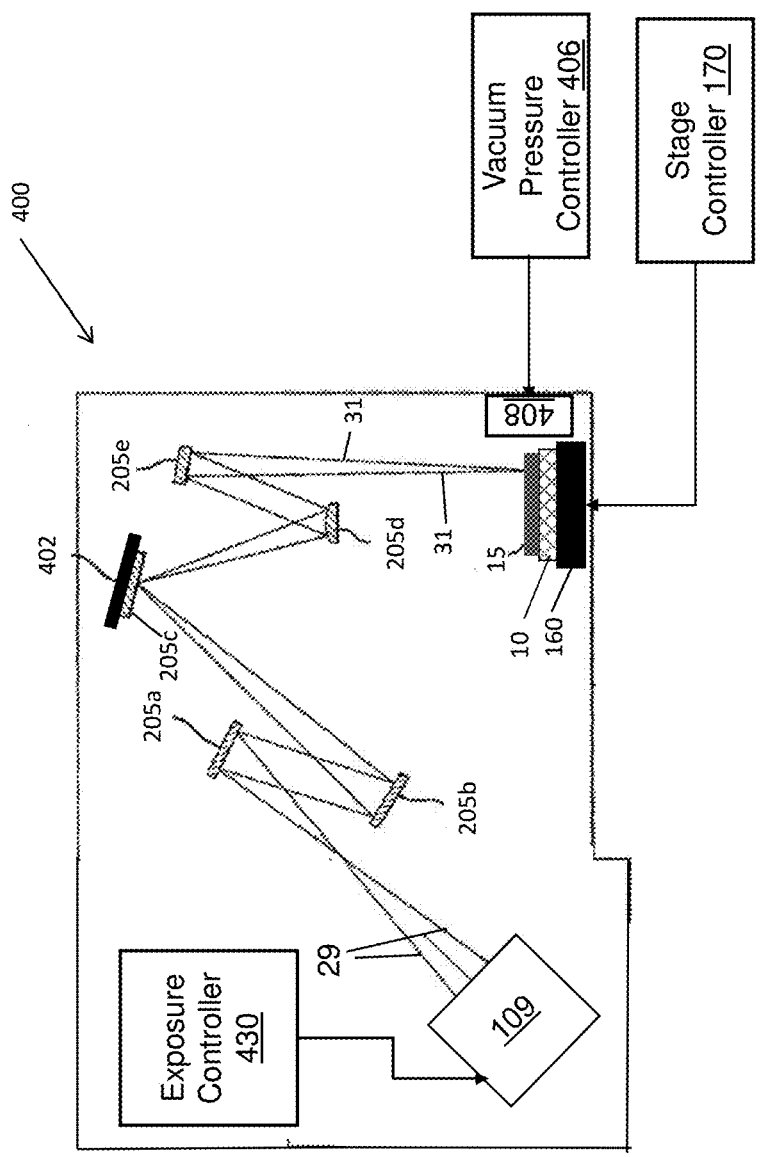
FIG. 4 shows a schematic view of an exposure device of a lithography system for generating a photo resist pattern on a wafer.

FIG. 1 shows a process flow 100 for generating a photo resist pattern on a semiconductor substrate. In some embodiments, the process flow 100 is performed by a lithography system that is controlled by the control system 800 of FIG. 8 and/or the computer system 1000 of FIGS. 10A and 10B. In a wafer load operation 101, a wafer is loaded on a stage. The wafer loading is described with respect to FIG. 2B. In a resist coat operation 102, a resist layer of a resist material is disposed, e.g., coated, on a top surface of a substrate, e.g., the wafer or a work piece. As shown in FIG. 4, a photo resist layer 15 is disposed over a semiconductor substrate 10. The post application bake (PAB) is performed at a PAB operation 104 and the semiconductor substrate 10 including the photo resist layer 15 is baked to drive out solvent in the resist material and solidify the photo resist layer 15 on top of the semiconductor substrate 10.

In the present disclosure, the terms mask, photomask, and reticle are used interchangeably. In addition, the terms resist and photo resist are used interchangeably. At a mask retrieve operation 105, a reticle is retrieved from a reticle library. The retrieved reticle is loaded by a mask load and exposure operation 108 to an exposure device, which is described with respect to FIG. 4. The mask load and exposure operation 108 also projects a layout pattern of the mask, using actinic radiation of a radiation source, onto the photo resist layer 15 of the semiconductor substrate 10.

In some embodiments, mask is a reflective mask and the layout pattern on the mask is projected by an extreme ultraviolet (EUV) radiation from an EUV light source onto the photo resist layer 15 to generate a resist pattern in the photo resist layer 15 on the semiconductor substrate 10. A post exposure bake (PEB) is performed at a PEB operation 110 on the wafer where the resist layer is further baked after being exposed to the actinic radiation and before being developed in a development operation 112. By applying a developer solution to the photo resist layer 15, the resist material of the resist layer is developed in the development operation 112. For a positive tone resist material, in the development operation 112, the exposed regions are developed by applying a developer solution and then the developed regions are removed and the remaining regions generate the resist pattern of the photo resist layer 15. For a negative tone resist material, in the development operation 112, the non-exposed regions are developed by applying the developer solution and the developed regions are subsequently removed and the remaining regions generate the resist pattern of the photo resist layer 15.

Figure 2A:
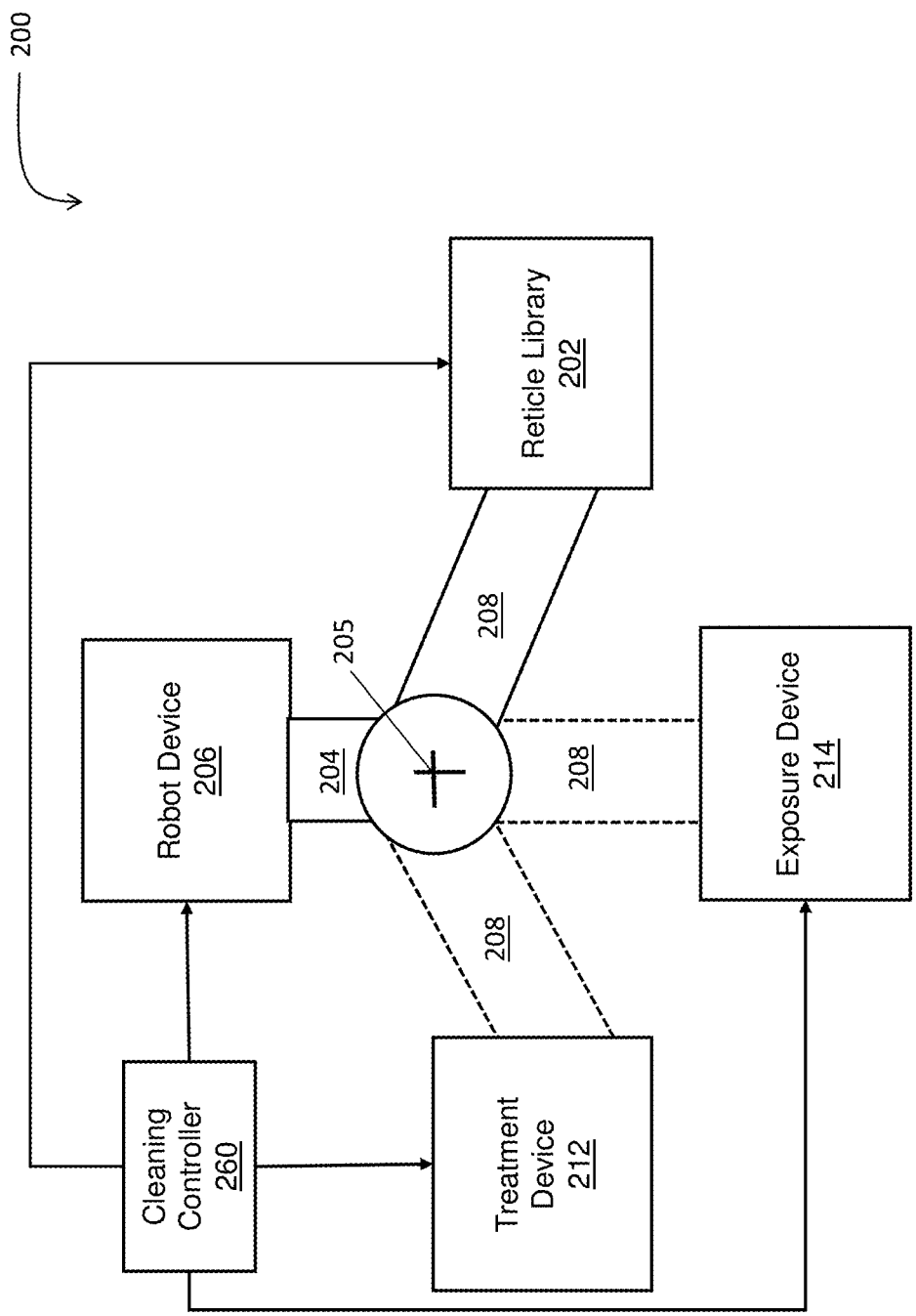
FIGS. 2A and 2B show handling systems for transferring reticles and wafers between multiple locations.
Figure 2B:
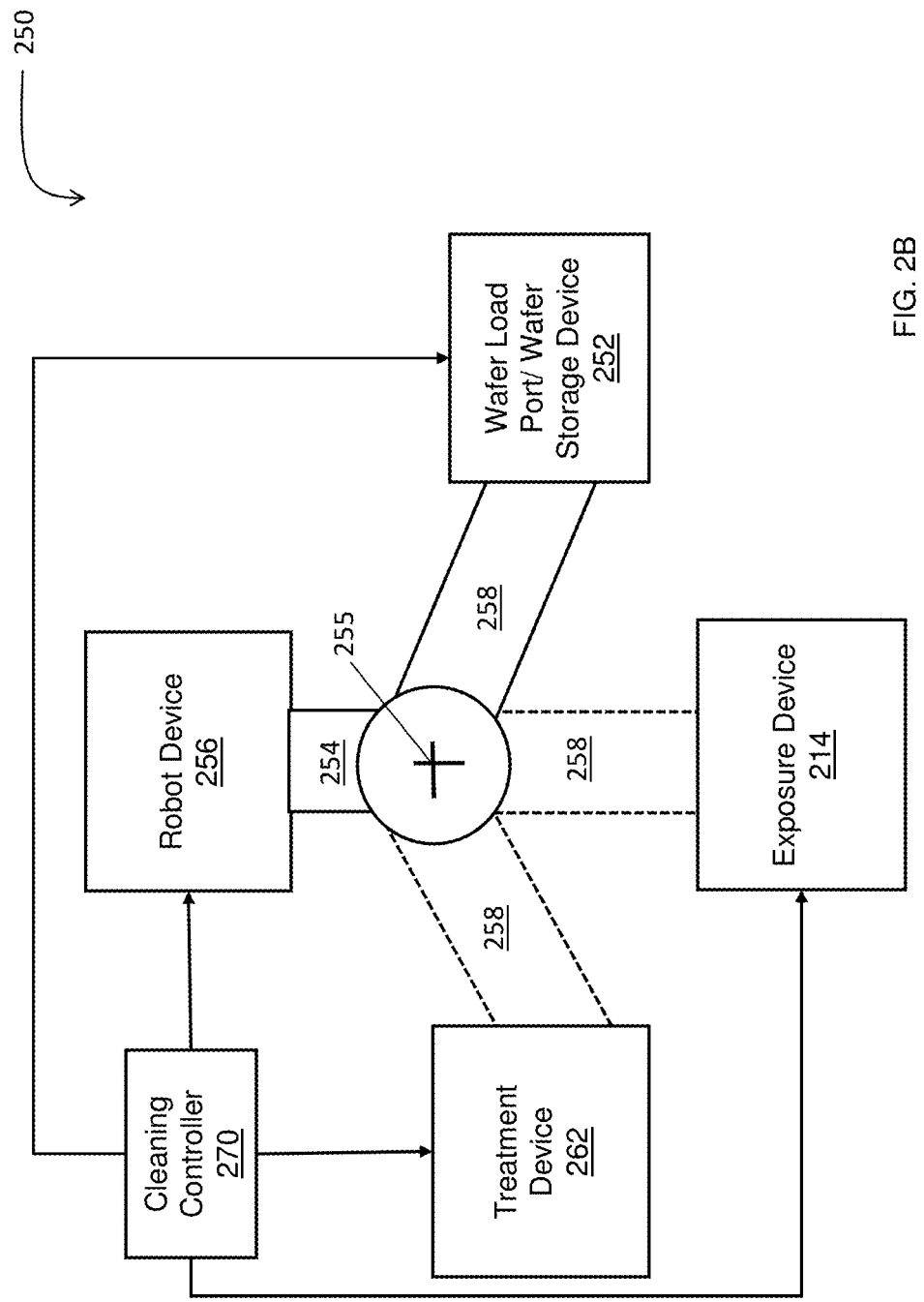

FIGS. 2A and 2B show a handling system for transferring reticles and wafers between multiple locations. FIG. 2A shows a handling system 200, a reticle handling system, for transferring reticles between different locations. The handling system 200 transfers reticles between a reticle library 202, a treatment device 212, and an exposure device 214. The handling system 200 includes a robot device 206 with a robot arm, e.g., a wafer exchange device. The robot arm includes a first movable segment 204 and a second movable segment 208. The second movable segment 208 rotates around the first pivot point 205. The first movable segment 204 rotates around a second pivot point (not shown) inside the robot device 206 and further moves the first pivot point 205 and the second movable segment 208. The robot device 206 may rotate the first movable segment 204 and the second movable segment 208 around the respective pivot points to extend the robot arm to the reticle library 202, to the treatment device 212, or to the exposure device 214. In some embodiments, the robot device 206, the reticle library 202, the treatment device 212, and the exposure device 214 are maintained in vacuum condition. The exposure device 214 is described with respect to FIG. 4.

The handling system 200 also includes a cleaning controller 260 coupled to the reticle library 202, the robot device 206, the treatment device 212, and the exposure device 214. In some embodiments, the cleaning controller 260 commands the robot device 206 to retrieve a reticle from the reticle library 202 and load the reticle to the treatment device 212 or to the exposure device 214. In some embodiments, the cleaning controller 260 commands the robot device 206 to retrieve the reticle from the treatment device 212 and to load the reticle to the exposure device 214. In some embodiments, the cleaning controller 260 commands the reticle library 202 to release one of the reticles to be retrieved. In some embodiments, the cleaning controller 260 commands the robot device 206 to load the reticle on a stage, e.g., a mask mounting stage, of the treatment device 212 or a mask mounting stage of the exposure device 214. The exposure device 214 is described with respect to FIG. 4 and the treatment device 212 is described with respect to FIG. 5C.

FIG. 2B is consistent with FIG. 2A and shows a handling system 250 for transferring wafers between different locations. The handling system 250 transfers wafers between a wafer load port/wafer storage 252, a treatment device 262, and a wafer processing apparatus, such as an exposure device 214. In other embodiments, the wafer processing apparatus includes a film deposition apparatus (e.g., CVD, PVD and ALD apparatuses, etc.), an etching apparatus (e.g., plasma dry etching apparatus and a wet etching apparatus, etc.), an impurity doping apparatus (e.g., a furnace and an ion implantation apparatus, etc.) and a measurement apparatus (e.g., a thickness measurement apparatus, an inspection apparatus, etc.), etc. The handling system 250 includes a robot device 256 with a robot arm, e.g., a wafer exchange device. The robot arm includes a first movable segment 254 and a second movable segment 258. The second movable segment 258 rotates around the first pivot point 255. The first movable segment 254 rotates around a second pivot point (not shown) inside the robot device 256 and further moves the first pivot point 255 and the second movable segment 258. The robot device 256 may rotate the first movable segment 254 and the second movable segment 258 around the respective pivot points to extend the robot arm to the wafer load port/wafer storage 252, to the treatment device 262, or to the exposure device 214. In some embodiments, the robot device 256, the wafer load port/wafer storage 252, the treatment device 262, and the exposure device 214 are maintained in vacuum condition.

The handling system 250 also includes a cleaning controller 270 coupled to the wafer load port/wafer storage 252, the robot device 256, the treatment device 262, and the exposure device 214. In some embodiments, the cleaning controller 270 commands the robot device 256 to retrieve a wafer from the wafer load port/wafer storage 252 and load the wafer to the treatment device 262 or the exposure device 214. In some embodiments, the cleaning controller 270 commands the robot device 256 to retrieve the wafer from the treatment device 262 and to load the wafer to the exposure device 214. In some embodiments, the cleaning controller 270 commands the wafer load port/wafer storage 252 to release a wafer to be retrieved. In some embodiments, the cleaning controller 270 commands the robot device 256 to load the wafer on a stage, e.g., a wafer mounting stage, of the treatment device 262 or a wafer mounting stage of the exposure device 214. The cleaning of a substrate, e.g., a semiconductor wafer, in the treatment device 262 and the cleaning of a substrate, e.g., a reticle, in the treatment device 212 is described with respect to FIGS. 5A, 5B, and 5C.

Figure 3:
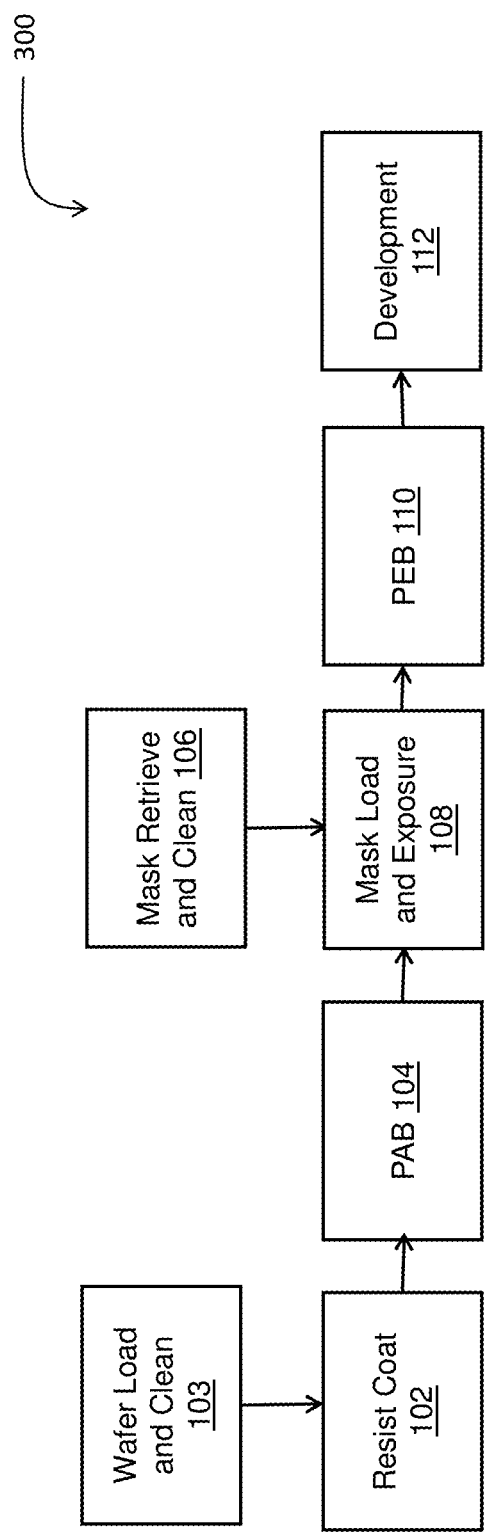
FIG. 3 shows a process flow for generating a photo resist pattern on a semiconductor substrate in accordance with some embodiments of the present disclosure.

FIG. 3 shows a process flow 300 for generating a photo resist pattern on a semiconductor substrate in accordance with some embodiments of the present disclosure. The process flow 300 includes the resist coat operation 102, the PAB operation 104, the PEB operation 110, and the development operation 112 of the process flow 100 of FIG. 1. In addition, the process flow 300 includes a mask retrieve and clean operation 106, which is performed by the handling system 200 of FIG. 2A. In the mask retrieve and clean operation 106, the cleaning controller 260 of FIG. 2A commands the robot device 206 and the reticle library 202. In response to the commands from the cleaning controller 260, the reticle library 202 releases a reticle and the second movable segment 208 of the robot device 206 extends into the reticle library 202 and retrieves the released reticle. Then, the cleaning controller 260 commands the robot device 206 to load the released reticle to the treatment device 212 for cleaning.

After loading the reticle to the treatment device 212, the cleaning controller 260 may command an ambient plasma generator (consistent with an ambient plasma generator 510 of FIG. 5C) of the treatment device 212 to generate a plasma wind (consistent with a plasma wind 506 of FIG. 5C) and to direct the plasma wind to the surface of the reticle for a predetermined amount of time to clean the surface of the reticle from particles and/or hydrocarbon contamination. The treatment device 212 and the ambient plasma generator are defined with respect to FIGS. 5A, 5B, and 5C.

In some embodiments, the plasma decomposes the hydrocarbon contamination and the particles on the surface of the wafer. Also, in the mask load and exposure operation 108, the reticle loaded in the treatment device 212 is transferred to the exposure device 214 and the mask is loaded, e.g., mounted, on a mask stage. Then, a radiation source of the exposure device 214, e.g., an EUV radiation source, projects the layout pattern of the reticle onto a photo resist layer of a wafer, e.g. a semiconductor substrate such as the photo resist layer 15 of the semiconductor substrate 10 of FIG. 4 to generate a resist pattern.

The process flow 300 includes a wafer load and clean operation 103. In some embodiments, the process of cleaning the wafer is performed by the treatment device 262 of FIG. 2B. The cleaning controller 270 commands the robot device 256 and the wafer load port/wafer storage 252. In response to the commands from the cleaning controller 270, the wafer load port/wafer storage 252 releases a wafer and the second movable segment 258 of the robot device 256 extends to the wafer load port/wafer storage 252 and retrieves the released wafer. In the wafer load and clean operation 103, the cleaning controller 270 commands the robot device 256 to load the released wafer to the treatment device 262 for cleaning.

After loading the wafer to the treatment device 262, the cleaning controller 270 may command an ambient plasma generator (consistent with an ambient plasma generator 510 of FIG. 5A) of the treatment device 262 to generate a plasma wind (consistent with a plasma wind 506 of FIG. 5A) and to direct the plasma wind to the surface of the wafer for a predetermined amount of time to clean the surface of the reticle from particles and/or hydrocarbon contamination. The treatment device 262 and the ambient plasma generator are defined with respect to FIGS. 5A, 5B, and 5C. In some embodiments, the plasma decomposes the hydrocarbon contamination and the particles on the surface of the wafer.

FIG. 4 shows a schematic view of an exposure device 400 of a lithography system for generating a resist pattern on a wafer. The exposure device 400 shows the exposure of the semiconductor substrate 10 with a patterned beam 31, such as extreme UV (EUV) light. The exposure device 400 may include a wafer movement device, e.g., a stage 160, a stepper, a scanner, a step and scan system, a direct write system, a device using a contact and/or proximity mask, etc., provided with one or more optics 205a, 205b, for example, to illuminate a patterning optics, such as a reticle, e.g., a reflective mask 205c with a radiation beam 29, e.g., an EUV radiation beam. The illumination of the patterning optics may produce a patterned beam 31, and one or more reduction projection optics 205d, 205e, of the optical system for projecting the patterned beam 31 onto a photo resist layer 15 of the semiconductor substrate 10. A stage controller 170 may be coupled to the wafer movement device, e.g., the stage 160, for generating a controlled relative movement between the semiconductor substrate 10 and the patterning optics, e.g., the reflective mask 205c. By the controlled relative movement, different dice of the semiconductor substrate 10 are patterned. In some embodiments, the reflective mask 205c is mounted on a reticle stage 402, e.g., a mask stage.

As further shown, the exposure device 400 of FIG. 4 includes a radiation source 109 to generate the radiation beam 29 used to irradiate the reflective mask 205c. In some embodiments, because gas molecules absorb EUV light, when the radiation source 109 is an EUV radiation source, the exposure device 400, when operated, is maintained under a vacuum environment to avoid EUV intensity loss. In addition, the exposure device 400 includes a radiation controller 430 to control an intensity of the radiation beam 29. In some embodiments, the radiation controller 430 adjusts the intensity of the radiation by adjusting a projection time of the lithography operation to pattern the resist layer. In some embodiments, a pressure inside the exposure device 400 is sensed by a pressure sensor 408 inside the exposure device 400 and is controlled by a vacuum pressure controller 406 that is coupled to the exposure device 400.

Figure 5B:
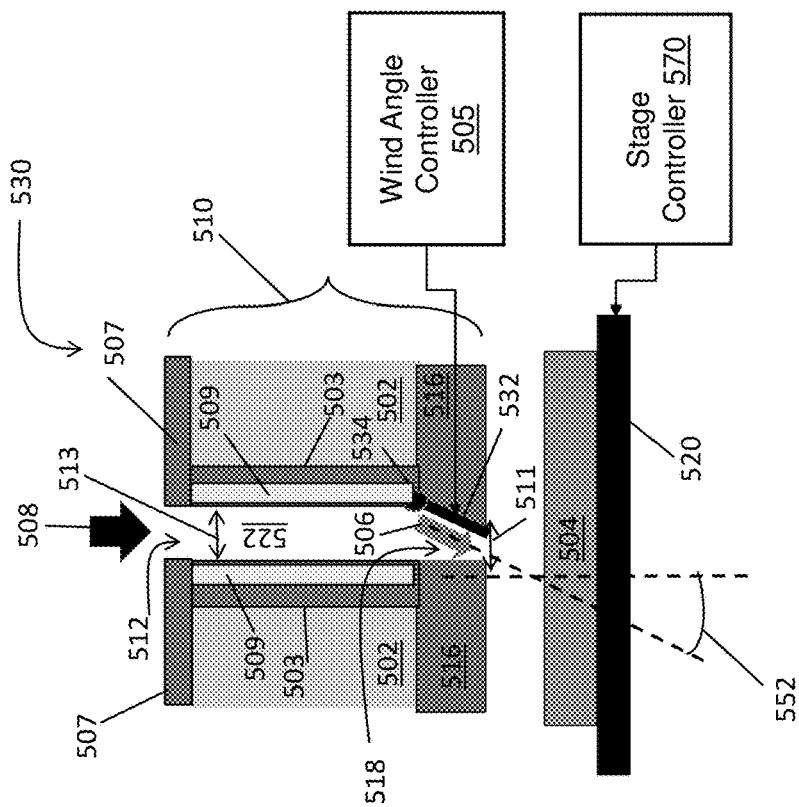
FIGS. 5A, 5B, and 5C show a treatment device using plasma wind for cleaning particles from substrates in accordance with some embodiments of the present disclosure.
Figure 5A:
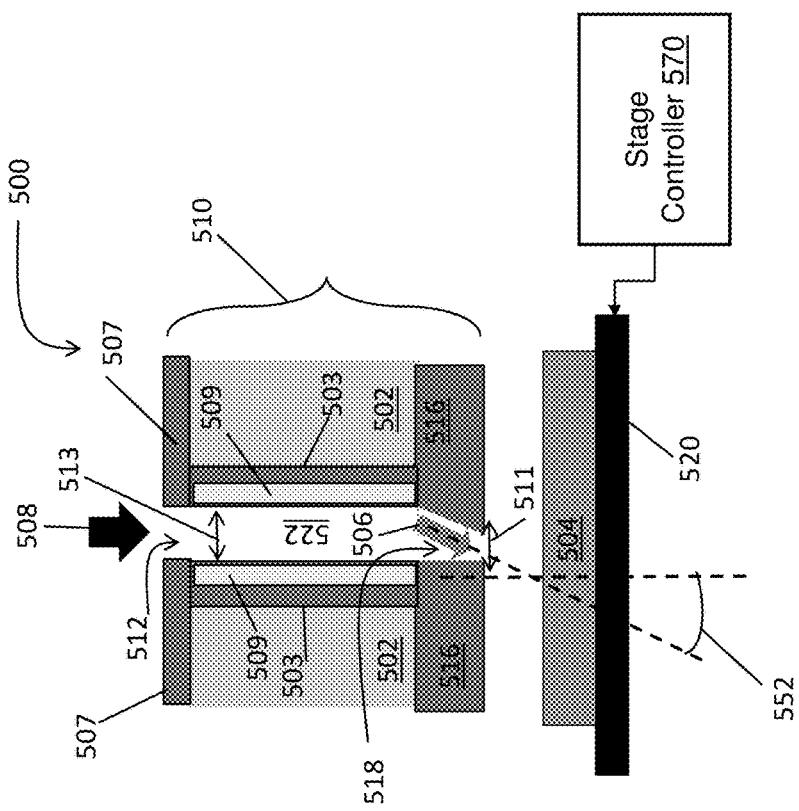
Figure 5C:
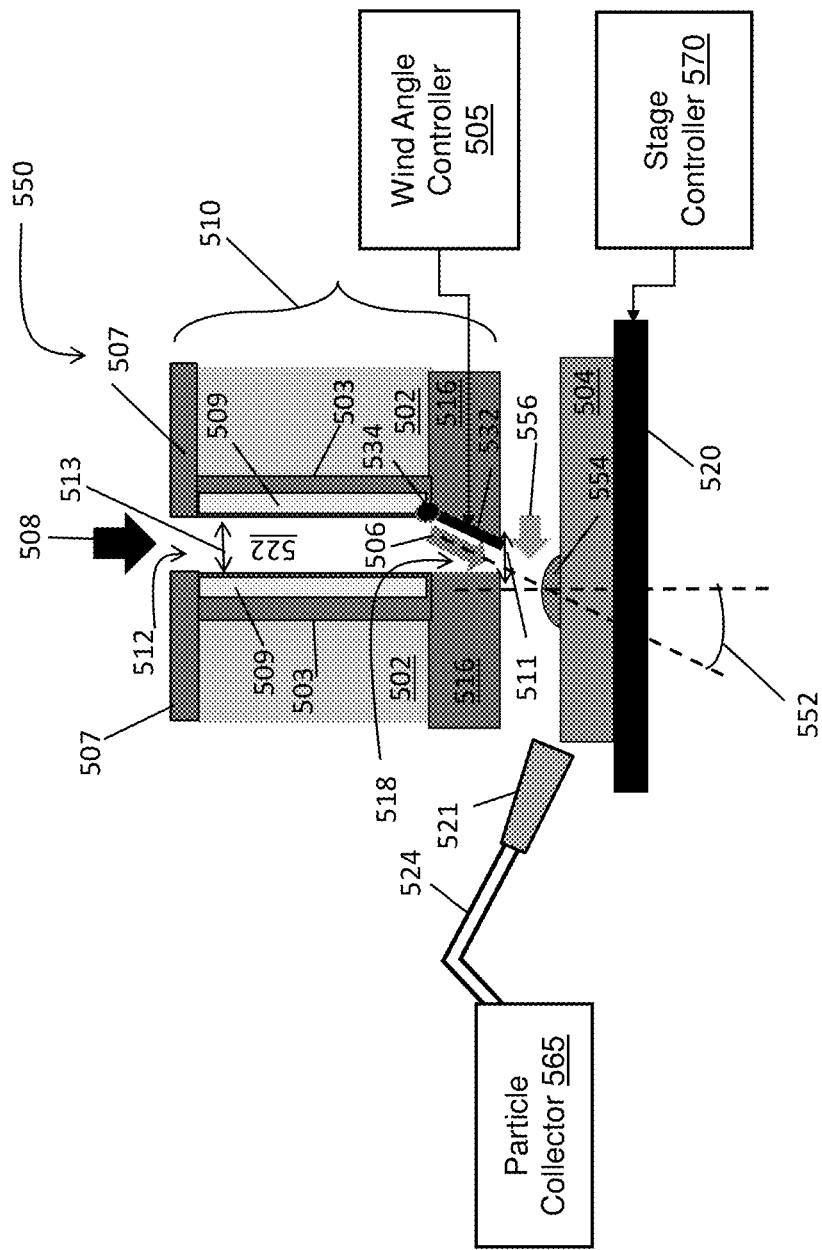

FIGS. 5A, 5B, and 5C show a treatment device using plasma wind for cleaning particles from substrates in accordance with some embodiments of the present disclosure. The treatment device 500 of FIG. 5A, which is consistent with the treatment devices 212 and 262 of FIGS. 2A and 2B, includes an ambient plasma generator 510 that includes a channel 522. The channel 522 is inside a body 502 and the body 502 surrounds the channel 522 with a channel wall 503 of the body 502 that is made of an insulating material, such as quartz or ceramic, in some embodiments. The channel wall 503 includes positive and negative electrodes 509 that are attached to an electric-control circuit (not shown) inside the body 502. The electric-control circuit provides respective positive and negative (e.g., ground) voltages to the positive and negative electrodes 509 that are inside the channel wall 503. In some embodiments, the positive and negative electrodes 509 are included in or attached to the channel wall 503. The positive and negative electrodes 509 of the channel wall 503 generate a strong, e.g., a high intensity, electric field of about 200 volts/mm to about 500 volts/mm in the channel 522, e.g., across a width 513 of the channel 522. In some embodiments, a voltage of about 200 volts to about 2000 volts is supplied by the electric-control circuit across the width 513 of the channel 522. In some embodiments, the width 513 of the channel 522 is between about 0.5 mm to about 4 mm. An input gas flow 508 (e.g., a helium gas flow or an argon gas flow) from a gas source (not shown) enters the channel 522 of the ambient plasma generator 510 from an input opening 512 of an input port 507. The strong electric field in the channel 522 transforms the input gas flow 508 into a plasma, e.g., an ambient plasma, which moves inside the channel 522 and exits the channel 522 through an output opening 518 of an output port 516. In some embodiments, the input gas flow 508 has a flow rate of between about 1 cubic centimeter per second to about 10 cubic centimeters. The input gas flow moves through the channel 522, is transformed, at least partially, into plasma by the strong electric field between electrodes inside the channel wall 503, and exits the channel 522, through the output opening 518, as the plasma wind 506 having the same flow rate as the input gas flow 508. In some embodiments, the gas pressure, e.g., the gas pressure of helium or argon, inside the channel 522 is as small as about 1 Torr and in some other embodiments, the gas pressure inside the channel 522 is about one atmosphere.

In some embodiments, the plasma wind 506 is directed to a surface of a substrate 504, while the substrate 504 is mounted on a stage 520. In some embodiments, one or more particles are attached to the surface of the substrate and the impact of the plasma wind 506 causes the particles to be removed. The stage 520 is coupled and controlled by a stage controller 570, consistent with the stage controller 170 of FIG. 4, which moves the substrate such that the plasma wind 506 is directed at different locations on the surface of the substrate 504. In some embodiments, the plasma wind 506 exits the channel 522 at an oblique angle 552 (e.g., the incident angle to substrate 504) with respect to a perpendicular plane to the surface of the substrate 504 below the ambient plasma generator 510. In some embodiments, the output opening 518 in the output port 516 of the plasma generator 510 has a width 511 between about 0.2 mm and about 10 mm. In some embodiments, the substrate 504 is a semiconductor substrate (e.g., a wafer) and in some other embodiments, the substrate 504 is reticle. In some embodiments, the body 502 is made of stainless steel and the output port 516 and the input port 507 are made of a dialectic material, e.g., silicone dioxide, ceramic (e.g., quartz), and the positive and negative electrodes 509 of the channel wall 503 are made of metal, e.g., steel or copper.

FIG. 5B shows a treatment device 530 that is consistent with the treatment device 500 with the difference that the ambient plasma generator 510 of FIG. 5B additionally includes a hinged wall 532 that rotates around a hinge 534. The hinged wall 532 is coupled and controlled by a wind angle controller 505 such that the hinged wall 532 rotates around the hinge 534 and the width 511 of the output opening 518 is adjusted by the wind angle controller 505. By increasing the width 511, the magnitude and oblique angle 552 of the velocity of the plasma wind 506 is reduced. By decreasing the width 511, the magnitude and oblique angle 552 of the velocity of the plasma wind 506 is increased. In some embodiments, the angle of the plasma wind 506 is between zero degrees and 90 degrees. In some embodiments, the angle of the plasma wind 506 is between 5 degrees and 85 degrees. In some embodiments, the substrate is one of a semiconductor substrate or a reticle that is mounted on the stage 520. In some embodiments, the hinged wall 532 is made of metal, e.g., steel or ceramic.

FIG. 5C shows a treatment device 550 that is consistent with the treatment device 530 with the difference that FIG. 5C shows a particle 554 disposed on the substrate 504. As shown, the plasma wind 506 is directed in the direction of the particle 554 to disintegrate the particle 554. In addition, FIG. 5C shows a gas flow 556 parallel to the surface of the substrate that is produced because of the oblique angle 552 of plasma wind 506. In some embodiments, the gas flow 556 is a component of the plasma wind that is parallel to the surface of the substrate 504. In some embodiments, the disintegrated segments of the particle 554 are pushed by the gas flow 556. In some embodiments, the wind angle controller 505 adjusts the width 511 of the output opening 518 such that the oblique angle 552 and the speed of the plasma wind 506 produces a gas flow 556 that pushes the disintegrated segments of the particle 554 off a designated area on the surface of the substrate 504 or off the entire surface of the substrate 504. FIG. 5C also shows the stage controller 570 that is coupled to the stage 520. In some embodiments, the stage controller 570 commands the stage 520 to move the stage 520 such that a particle on the surface of the substrate 504 is brought under the direction of the plasma wind 506. In some embodiments, the stage does not move until the particle is removed by the plasma wind 506 and then the stage moves such that the next particle is brought under the direction of the plasma wind 506. In some embodiments, the stage controller receives a map of the particles on the surface of the substrate 504 and the stage controller 570 moves the stage 520 and the substrate 504 mounted on the stage 520 such that all the particle on the surface of the substrate 504 are consecutively brought under the plasma wind 506 and the particle is removed and the surface of the substrate is cleaned from the particles.

In some embodiments, the stage 520 stops between about 0.1 seconds to 5 seconds at each location such that the plasma wind 506 cleans the particle. In some embodiments, the map of the particles in addition to the location includes the size of the particles disposed on the surface of the substrate 504. The amount of time the stage controller 570 keeps the stage 520 at each location corresponding to each particle on the surface of the substrate 504 depends on the size of the particle. In some embodiments, the stage 520 stops longer at the locations corresponding to the larger particles. In some embodiments, as shown in FIG. 5C, the treatment device 550 includes a particle collector 565, e.g., a particle counter, attached by a pipe 524 to a nozzle 521. In some embodiments, the particle collector 565 exerts a vacuum to pull in the particles. The nozzle 521 is placed around a top surface of the substrate 504 to pull in the disintegrated segments of the particle 554, via the nozzle 521, into the particle collector 565.

Figure 6B:
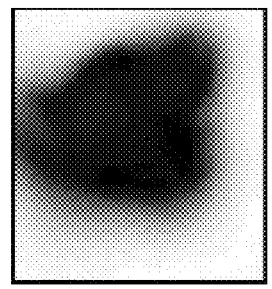
FIGS. 6A and 6B show a surface of the substrate and a particle on the surface of the substrate.
Figure 6A:
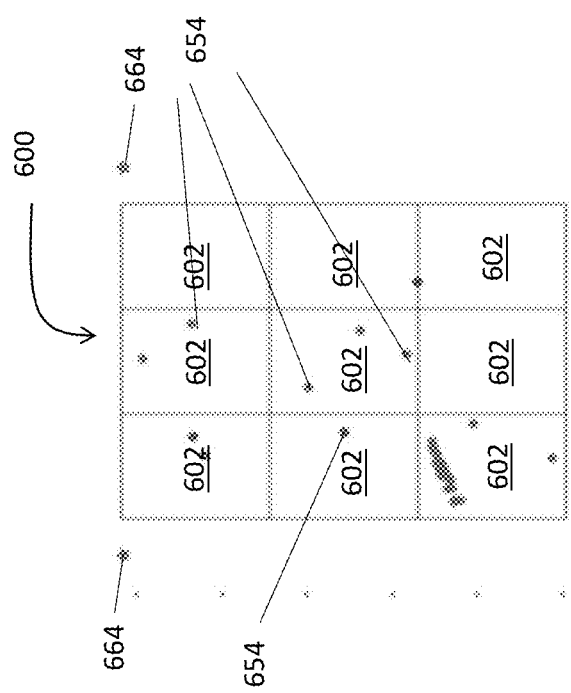

FIGS. 6A and 6B show a surface of the substrate and a particle on the surface of the substrate. FIG. 6A shows an area 600 on the surface of the substrate 504, e.g., a designated area. The area 600 is divided into a number of segments 602. The area 600 includes a number of particles 654 and 664. The particles 664 are outside the area 600, however, the particles 654 are distributed on the area 600 and need cleaning. As described below, the inspection device 700 determines a map of the particles (location and size) in area 600 and sends the map to the stage controller 570 of the treatment device 550 for cleaning. In some embodiments, the stage controller 570 moves the stage 520 such that the plasma wind 506 is consecutively directed at the particles 654 and the particles 654 are removed. FIG. 6B shows an enlarged particle 654 inside the area 600.

Figure 7B:
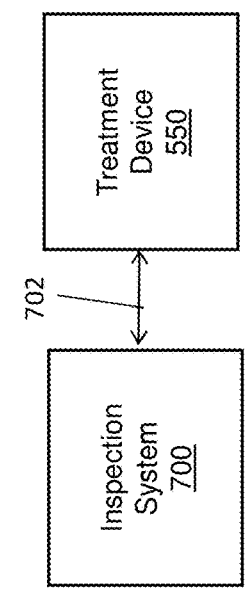
FIGS. 7A and 7B show an inspection system of the particles on a surface of a substrate and a system for cleaning the substrate in accordance with some embodiments of the present disclosure.
Figure 7A:
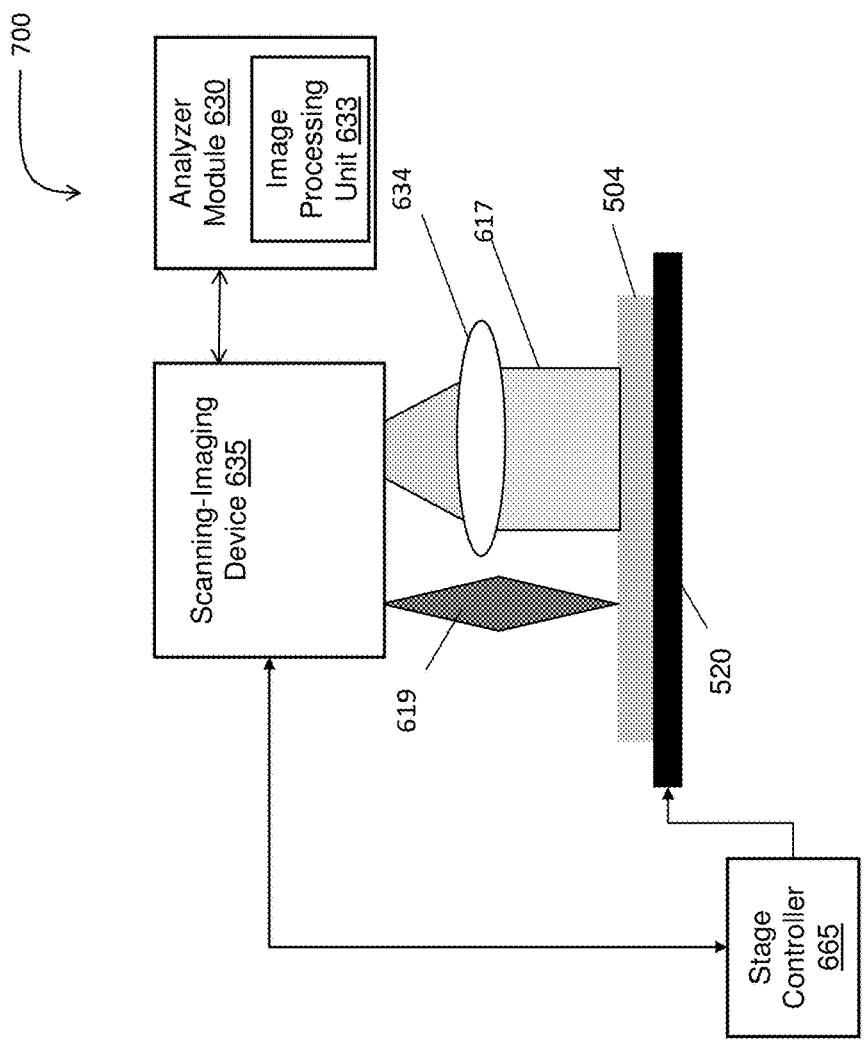

FIGS. 7A and 7B show an inspection device 700 of the particles on a surface of a substrate and a system for cleaning the substrate in accordance with some embodiments of the present disclosure. FIG. 7A shows a scanning-imaging device 635 that generates a focusing beam 619 for scanning a top surface of the substrate 504 and generating an image of the top surface of the substrate 504. In addition, FIG. 7A shows the scanning-imaging device 635 and a lens 634 that generates a uniform light beam 617 for imaging the top surface of the substrate 504 and generating the image of the top surface of substrate 504. FIG. 7A shows the substrate 504 disposed on the stage 520. The stage 520 is coupled and controlled by a stage controller 665. In some embodiments, the substrate 504 is a wafer and in some other embodiments the substrate 504 is a reticle. The scanning-imaging device 635 captures one or more images of the surface of the substrate 504 at different locations of the substrate 504 and sends the images to the analyzer module 830 or the analyzer module 630. The analyzer module 830 or the image processing unit 633 of the analyzer module 630 determines the number of particles and locations of the particles on the substrate 504, e.g., a map of the particles. If the number of particles, or a density of the particles, e.g., particles per millimeter squared of the surface of the substrate 504, is above a threshold, the substrate is sent or is sent back to the treatment device 212, 262, or 550 for cleaning. In some embodiments, the threshold density of the particles is between about zero to about 0.1 per millimeter squared. As described, in some embodiments, the map of the particles including the size of the particles is sent to the analyzer module 830 or the stage controller 570. In some embodiments, after the cleaning, the substrate 504 is imaged by the scanning-imaging device 635 and if the density of the particles is not within the threshold, the substrate is cleaned again.

FIG. 7B shows the cleaning system 750 that includes the inspection device 700 and the treatment device 550. In some embodiments, the particles, e.g., particles 654 and 664 of FIG. 6A, on the surface of a substrate, e.g., the substrate 504, are inspected by the inspection system and a map 702 of the particles on the surface of the substrate, e.g., location and size, are generated. The substrate and the map 702 are transferred to the treatment device 550. The stage controller 570 of the treatment device 550 consecutively moves the stage 520 to each one of the particles and the plasma wind 506 of the treatment device 550 removes the particle. The substrate is sent back to the inspection device 700 for inspection and if the inspection device 700 determines that particles exist on the surface the substrate or if the number and/or size of particles on the surface of the substrate is not within the threshold range, a map 702 of the particles is generated and the map 702 and the substrate are sent back to the treatment device 550 for removal of the particles. In some embodiments, the inspection and cleaning cycle is repeated until the number and/or size of particles on the surface of the substrate is within the threshold range. In some embodiments, the cleaning system 750 is used to determine a cleaning time of the particles. As noted, in some embodiments, the map 702 of the particles include the particle size and, thus, the removal of a particle depends on the size of the particle. Based on the repeated cycles of inspection and cleaning, the stage controller 570 of the treatment device 550 may determine a total cleaning time for the removal of each particle as a sum of the cleaning times and may determine the total cleaning time a predetermined time for the removal of the particles based on the size of the particle. In some embodiments, the stage controller 570 of the treatment device 550 generates a relation, e.g., a table, between the particle size and the time that is required to remove the particle. Thus, in some embodiments, for each particle, the stage controller 570 keeps the particle under the plasma wind 506 for an amount of time that is based on the size of the particle. In some embodiments, the width 511 of the output opening 518 of the ambient plasma generator 510 the treatment device 550 adjusted based on the particle size such that the speed of the plasma wind 506 is increased for larger particles. In some embodiments, the inspection device 700 is included in the treatment device 550 such that stage controller 665 is replaced with the stage controller 570. The stage controller 570 moves the stage 520 and the substrate 504 such that the substrate 504 is located under the scanning-imaging device 635 and is inspected. In addition, the stage controller 570 moves the stage 520 and the substrate 504 such that the substrate 504 is located under the ambient plasma generator 510 and is cleaned.

Figure 8:
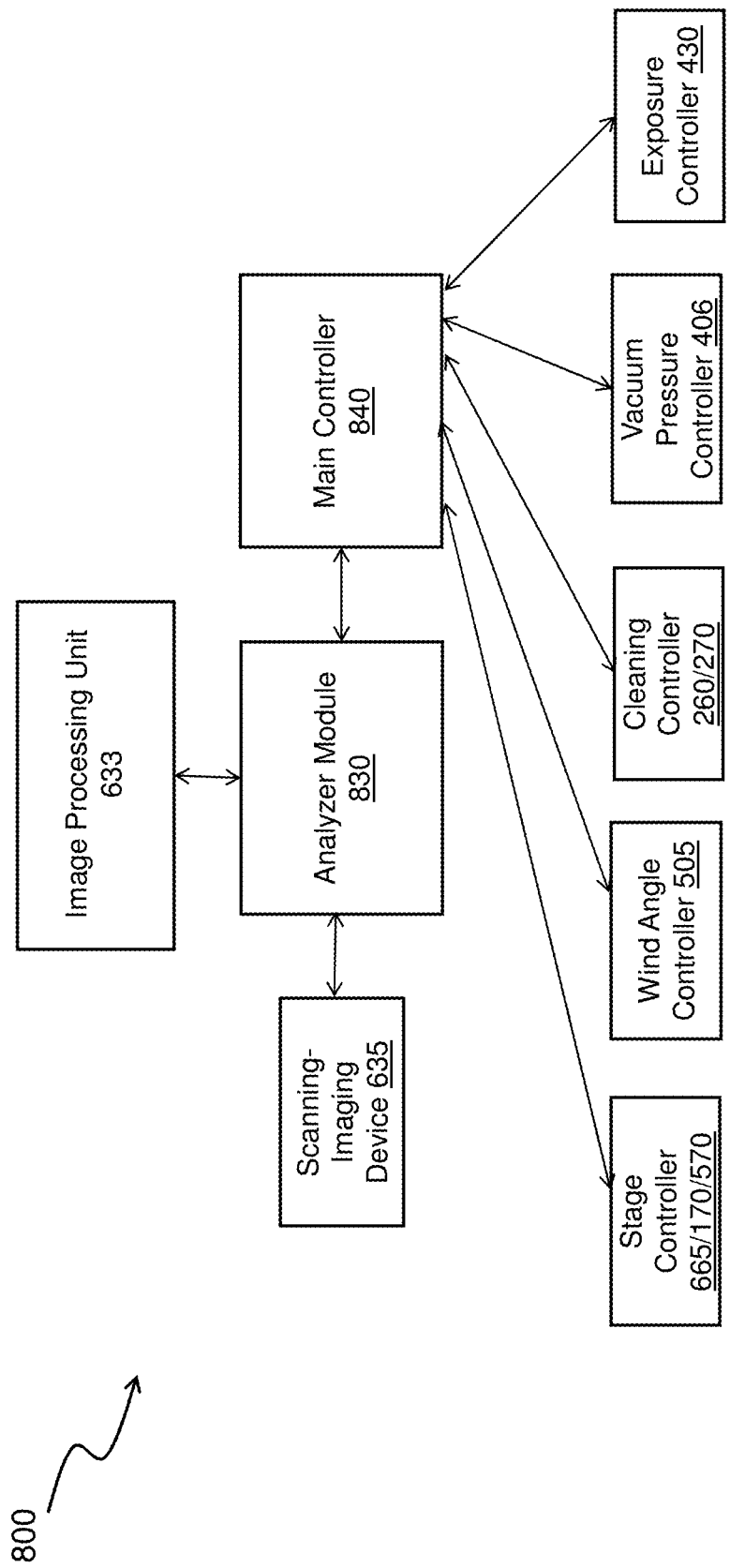
FIG. 8 shows a control system for cleaning a reticle or wafer substrate and projecting layout patterns of the reticle on the wafer in accordance with some embodiments of the present disclosure.

FIG. 8 shows a control system 800 for cleaning a reticle or wafer and projecting layout patterns of the reticle on the wafer in accordance with some embodiments of the present disclosure. The control system 800 includes an analyzer module 830 and a main controller 840 coupled to each other. In some embodiments, the control system 800 includes the stage controllers 665, 170, and 570 of FIGS. 4, 5C, and 7A, and the cleaning controller 260 of FIG. 2A or 270 of FIG. 2B, the scanning-imaging device 635 of FIG. 7, and the vacuum pressure controller 406 of FIG. 4. In some embodiments, the main controller 840 is coupled to and controls the stage controller 665, 170, or 570, the cleaning controller 260 or 270, the scanning-imaging device 635, and the vacuum pressure controller 406. In some embodiments, the main controller 840 is directly coupled to the scanning-imaging device 635 or is coupled to the scanning-imaging device 635 via the analyzer module 830. In some embodiments, the scanning-imaging device 635 acquires an image of the substrate 504 that is mounted on the stage 520 and sends the acquired image to the analyzer module 630 or 830. The analyzer module 630 or 830 determines a map of the particles (location and size) on the surface of the substrate and sends the map via the main controller 840 to the stage controller 570.

In some embodiments, the analyzer module 830 is consistent with or includes the analyzer module 630 of FIG. 7A. In some embodiments, the main controller 840 commands the scanning-imaging device 635, via the analyzer module 830, to capture an image of the resist pattern on a semiconductor substrate and determine, e.g., measure, the CDU of the resist pattern disposed on the semiconductor substrate. As described above, the analyzer module 830 determines, based on the measured CDU, if the surface of the reticle and/or the surface of the wafer is cleaned. In some embodiments, the main controller 840 commands the stage controller 665 to move the stage 660 to capture one or more images of the resist pattern disposed on the semiconductor substrate at different locations. In some embodiments, the main controller 840 commands the vacuum pressure controller 406 to maintain a vacuum environment inside the treatment device 212 and the exposure device 214 and to maintain a vacuum environment inside the reticle library 202. In some embodiments, the main controller 840 commands the cleaning controller 260 to clean a surface of the reticle in the treatment device 212 and to load the cleaned reticle to a exposure device 214 and project the layout pattern of the reticle on a photo resist layer of substrate. In some embodiments, the main controller 840 commands the analyzer module 830 to capture a reflected image from the reticle or the wafer after the cleaning and to transfer the captured image to the analyzer module 830 or 630 for analysis.

In some embodiments, the analyzer module 830 includes or is coupled to the image processing unit 633. In some embodiments, the main controller 840 commands the scanning-imaging device 635 to continuously scan the surface of the reticle or wafer and determine the particles or a density of the particles on the surface of the reticle or the wafer.

Figure 9A:
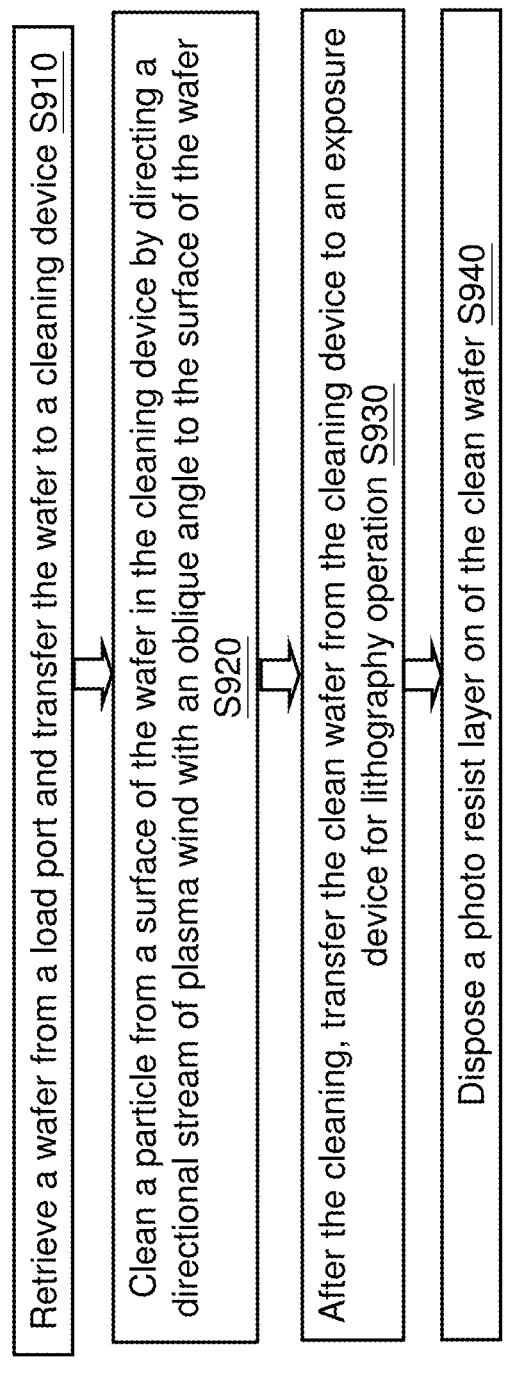
FIGS. 9A and 9B show flow diagrams of an exemplary process for cleaning a reticle or a semiconductor wafer and projecting layout patterns of the reticle onto the semiconductor substrate in accordance with some embodiments of the present disclosure.
Figure 9B:
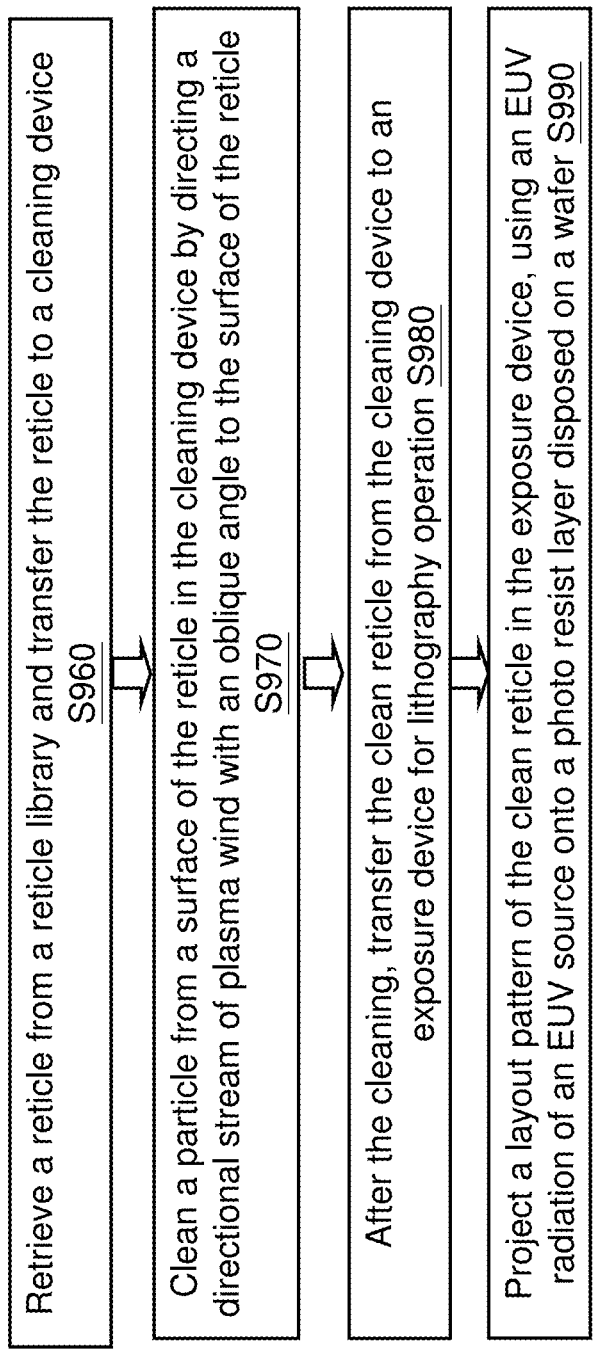

FIGS. 9A and 9B show a flow diagram of an exemplary process for cleaning a reticle or a semiconductor wafer and projecting layout patterns of the reticle onto the semiconductor substrate in accordance with some embodiments of the present disclosure. FIG. 9A illustrates a flow diagram of a process 900 for cleaning a reticle and projecting layout patterns of the cleaned reticle on a semiconductor substrate in accordance with some embodiments of the present disclosure. The process 900 or a portion of the process 900 may be performed by the system of FIG. 2B. In some embodiments, the process 900 or a portion of the process 900 is performed and/or is controlled by the computer system 1000 described below with respect to FIGS. 10A and 10B. In some embodiments, the process 900 or a portion of the process 900 is performed by the control system 800 of FIG. 8 described above. The method includes an operation S910, where a wafer is retrieved from load port and is transferred to a cleaning device. As shown in FIG. 2B, a wafer is retrieved by the robot arm of the robot device 256 from the wafer load port/wafer storage 252. After the retrieval of the wafer, the robot arm delivers the wafer to the treatment device 262.

In operation S920, a particle from the surface of the wafer is cleaned, in the treatment device 262, by exposing the surface of the wafer by a directional stream of plasma wind, generated by an ambient plasma generator, for a predetermined amount of time. As shown in FIG. 5C, the surface of the wafer is cleaned, in the treatment device 262, from particles. The stream of plasma wind has an oblique angle with respect to a perpendicular plane to the surface of the wafer. In some embodiments, the plasma wind is generated by the ambient plasma generator 510.

In operation S930, after the cleaning, the wafer is transferred from the treatment device to an exposure device for lithography operation. As shown in FIG. 2B, after cleaning the wafer, the wafer is transferred from the treatment device 262 to the exposure device 214. The wafer is transferred by the robot arm of the robot device 256. In the exposure device 214 the lithography operation is performed using the layout patterns of a reticle.

In operation S940, in the exposure device, a photo resist layer is disposed on the wafer. As shown in FIG. 4, the photo resist layer 15 is disposed on the semiconductor substrate 10, e.g., the wafer, which is mounted on the stage 160.

FIG. 9B illustrates a flow diagram of a process 950 for cleaning a reticle and projecting layout patterns of the cleaned reticle on a semiconductor substrate in accordance with some embodiments of the present disclosure. The process 950 or a portion of the process 950 may be performed by the system of FIG. 2A. In some embodiments, the process 950 or a portion of the process 950 is performed and/or is controlled by the computer system 1000 described below with respect to FIGS. 10A and 10B. In some embodiments, the process 950 or a portion of the process 950 is performed by the control system 800 of FIG. 8 described above. The method includes an operation S960, where a reticle is retrieved from a reticle library and is transferred to a cleaning device. As shown in FIG. 2A, a reticle is retrieved by the robot arm of the robot device 206 from the reticle library 202. After the retrieval of the reticle, the robot arm delivers the reticle to the treatment device 212.

In operation S970, a particle from a surface of the reticle is cleaned, in the treatment device 212 or 550, by exposing the surface of the reticle to a directional stream of plasma wind 506, generated by an ambient plasma generator, for a predetermined amount of time. As shown in FIG. 5C, the surface of the reticle is cleaned, in the treatment device 550, from particles. The stream of plasma wind has the oblique angle 552 with respect to a perpendicular plane to the surface of the reticle. In some embodiments, the plasma wind is generated by the ambient plasma generator 510. In some embodiments, the oblique angle 552 is adjusted by moving hinged wall 532 and modifying the width 511 of the output opening 518 of the ambient plasma generator 510. In some embodiments, the plasma wind is essentially parallel to the hinged wall 532. Thus, by increasing the width 511, the oblique angle 552 decreases and by decreasing the width 511, the oblique angle 552 increases.

In operation S980, after the cleaning, the reticle is transferred from the treatment device to an exposure device for lithography operation. As shown in FIG. 2A, after cleaning the reticle, the wafer is transferred from the treatment device 212 to the exposure device 214. The reticle is transferred by the robot arm of the robot device 206. In the exposure device 214, the lithography operation is performed using the layout patterns of the reticle and projecting the layout patterns of the reticle on a wafer.

In operation S990, in the exposure device, a layout patterns of the reticle is projected onto a photo resist layer of the wafer. As shown in FIG. 4, the layout pattern of the respective reflective mask 205c is projected onto a photo resist layer 15 of the respective semiconductor substrate 10.

Figures 10A, 10B:
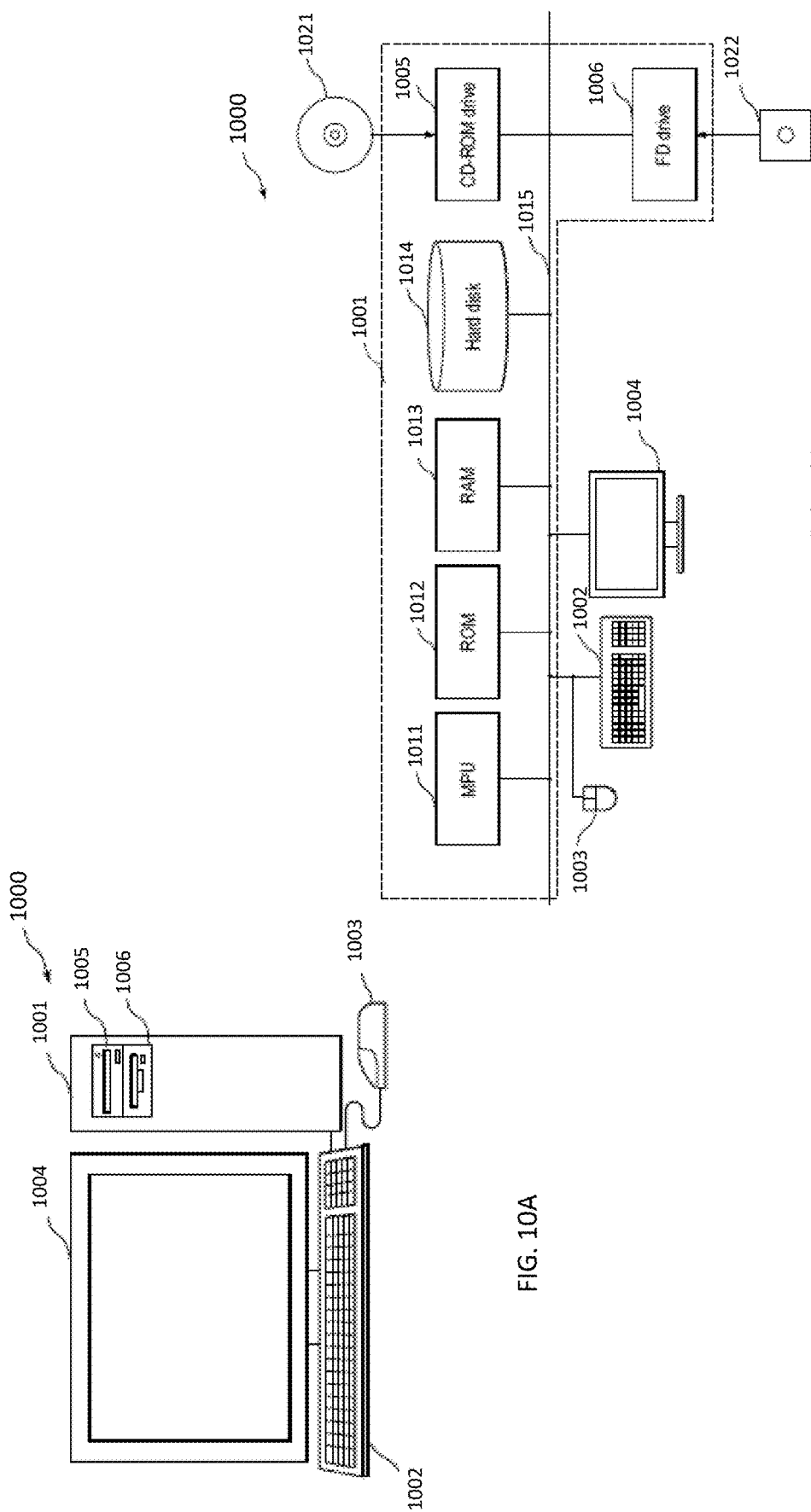
FIGS. 10A and 10B illustrate an apparatus for cleaning a reticle or a semiconductor wafer and projecting layout patterns of the reticle onto the wafer in accordance with some embodiments of the present disclosure.

FIGS. 10A and 10B illustrate an apparatus for cleaning a reticle or a semiconductor wafer and projecting layout patterns of the reticle onto the wafer in accordance with some embodiments of the present disclosure. In some embodiments, the computer system 1000 is used for performing the functions of the modules of FIG. 8 that include the main controller 840, the analyzer module 830, the stage controller 665, 170, or 570, the cleaning controller 260 or 270, the vacuum pressure controller 406, and the image processing unit 633 of the analyzer module 830 or 630. In some embodiments, the computer system 1000 is used to execute the process 900 or 950 of FIG. 9A or FIG. 9B.

FIG. 10A is a schematic view of a computer system that performs the functions of an apparatus for cleaning reticles and/or wafers and projecting layout patterns of the cleaned reticle on a wafer (the cleaned wafer). All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions for cleaning reticles and/or wafers and projecting layout patterns of the reticles in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for cleaning reticles or wafers and projecting layout patterns of the reticles in the foregoing embodiments. The program may only include a command portion to call an appropriate function (module) in a controlled mode and obtain desired results.

According to some embodiments of the present disclosure, a method of manufacturing a semiconductor device includes retrieving a semiconductor wafer via a load port and transferring the semiconductor wafer to a treatment device. The method also includes cleaning a particle from a surface of the semiconductor wafer in the treatment device by exposing the surface of the semiconductor wafer to a directional stream of plasma wind. The directional stream of plasma wind is generated for a predetermined plasma exposure time by an ambient plasma generator. The directional stream of plasma wind is directed at an oblique angle with respect to a perpendicular plane to a surface of the semiconductor wafer. After the cleaning, the method also includes disposing a photo resist layer on the semiconductor wafer. In an embodiment, the method further includes that prior to the cleaning, inspecting a surface of the semiconductor wafer; generating a map of one or more particles on the surface of the semiconductor wafer such that the map includes particle locations; and consecutively cleaning the one or more particles from a surface of the semiconductor wafer in the treatment device, by moving the semiconductor wafer according to the map. In an embodiment, the map includes particle sizes and the method further includes adjusting a speed of the directional stream of plasma wind based on the particle size. In an embodiment, the method further includes adjusting a width of an output opening of an output port of the ambient plasma generator to adjust the speed of the directional stream of plasma wind. In an embodiment, the method further includes directing a gas flow of argon into the ambient plasma generator to generate the directional stream of plasma wind. In an embodiment, the method further includes imaging a surface of the semiconductor wafer to generate an image of the surface of the semiconductor wafer, and analyzing the generated image of the surface of the semiconductor wafer to generate the map. In an embodiment, the method further includes that for each particle, repeating the cleaning, the inspecting, the imaging, the analyzing to generated the map, until the particle is removed; determining a total time of cleaning for each particle; determining a size of each particle; and determining the total time of cleaning as the predetermined plasma exposure time associated with the size of the particle.

According to some embodiments of the present disclosure, a method of manufacturing a semiconductor device includes cleaning a particle from a surface of a reticle in a treatment device by exposing the surface of the reticle to a directional stream of plasma wind. The directional stream of plasma wind is generated by an ambient plasma generator at an oblique angle with respect to a perpendicular plane to a surface of the reticle for a predetermined plasma exposure time. After the cleaning, the method also includes transferring the reticle from the treatment device to an exposure device for lithography operation. The method further includes projecting a layout pattern of the reticle using an incident extreme UV (EUV) radiation of an EUV source of the exposure device onto a photo resist layer of a wafer. In an embodiment, the method further includes directing a gas flow of helium into the ambient plasma generator to generate the directional stream of plasma wind. In an embodiment, the cleaning the surface of the reticle include cleaning a first region of two or more non-overlapping regions on the surface of the reticle in the treatment device by exposing the first region of the two or more non-overlapping regions on the surface of the reticle to the directional stream of plasma wind at the oblique angle for the predetermined plasma exposure time such that each non-overlapping region comprises one or more particles; and repeat the cleaning on other regions of the two or more non-overlapping regions on the surface of the reticle to clean entire surface of reticle. In an embodiment, the method further includes applying a high intensity electric field to the gas flow of helium inside the ambient plasma generator to generate the directional stream of plasma wind. In an embodiment, the method further includes adjusting a width of an output opening of the ambient plasma generator to adjust a speed and angle of the directional stream of plasma wind. In an embodiment, the method further includes adjusting the oblique angle of the directional stream of plasma wind between 30 degrees and 80 degrees with respect to the perpendicular plane to the surface of the reticle to drive the particle off the surface of the reticle. In an embodiment, the method further includes adjusting a width of an output opening of an output port of the ambient plasma generator between 100 microns and 5 mm to adjust the angle and speed of the directional stream of plasma wind.

According to some embodiments of the present disclosure, a semiconductor manufacturing system includes a main controller, an analyzer module coupled to the main controller, a wafer exchange device having an extendable robot arm, a treatment device, and an exposure device. The treatment device includes a first stage to mount a reticle or a wafer and an ambient plasma generator. The exposure device includes a second stage to mount the reticle, an extreme ultraviolet (EUV) light source, and a third stage to hold a wafer. The main controller is commands the ambient plasma generator to direct a directional stream of plasma wind, for a predetermined plasma exposure time, in a direction of the first stage to clean a particle from a surface of the reticle or the wafer that is mounted on the first stage of the treatment device. After the cleaning, the main controller commands the wafer exchange device to transfer the reticle or the wafer, by the extendable robot arm, from the treatment device to the exposure device for lithography operation. In an embodiment, the treatment device further includes a hinged wall coupled to a wind angle controller at an output opening of an output port of the ambient plasma generator. The wind angle controller rotates the hinged wall to change a direction and speed of the directional stream of plasma wind. In an embodiment, the treatment device further includes a scanning-imaging device. In response to a command from the main controller, the first stage moves under the scanning-imaging device and the scanning-imaging device captures an image of the surface of the reticle or the wafer and transfers the captured image to the analyzer module. The analyzer module determines a map of particles on the surface of the wafer or the reticle. In an embodiment, the ambient plasma generator further includes a channel surrounded by a body; and positive and negative electrodes in the body that are attached to a wall of the channel. The positive and negative electrodes generate a high intensity electric field inside the channel to produce plasma in gas flow that passes through the channel. In an embodiment, the system further includes a reticle library such that prior to directing the directional stream of plasma wind to the surface of the reticle, the main controller sends a command to the wafer exchange device to retrieve the reticle from the reticle library and to transfer the reticle to the treatment device. In an embodiment, the system further includes an inspection device that includes a fourth stage configured to hold a wafer or a reticle; and a scanning-imaging device that is mounted over the fourth stage to acquire an image of the surface of the wafer or reticle and to send the acquired image to the analyzer module. The analyzer module generates a map of particle on the surface of the wafer or reticle and sends the map of the particles to the treatment device. The treatment device consecutively removes each one of the particles by the directional stream of plasma wind.

As described in the foregoing embodiments, the surface of a reticle or a wafer is cleaned by a directional stream of plasma wind such that fall-on particles are one by one removed and no solvent is used. The forgoing embodiments, cleans the semiconductor substrate and increases the wettability of the semiconductor substrate and, thus, a photo resist layer may be distributed and be in contact on the entire surface of the semiconductor substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   retrieving a substrate from a substrate storage;
   transferring the substrate to a cleaning device;
   inspecting a surface of the substrate;
   generating a map of one or more particles on the surface of the substrate, wherein the map includes particle locations and the map includes particle sizes;
   consecutively cleaning the one or more particles from the surface of the substrate in the cleaning device, by moving the substrate according to the map and by exposing the surface of the substrate to a plasma wind stream at an oblique angle with respect to a perpendicular plane to the surface of the substrate for a predetermined exposure time to remove the one or more particles from the surface of the substrate;
   adjusting a speed of the plasma wind stream based on the particle sizes;
   adjusting a width of an output opening of an output port of an ambient plasma generator to adjust the speed of the plasma wind stream; and
   transferring the substrate to a semiconductor manufacturing apparatus.

2. The method according to claim 1, further comprising:
   directing a gas flow of argon into the ambient plasma generator to generate the plasma wind stream.

3. The method according to claim 1, further comprising:
   imaging the surface of the substrate to generate an image of the surface of the substrate; and
   analyzing the generated image of the surface of the substrate to generate the map.

4. The method according to claim 3, further comprising:
   for each particle, repeating the cleaning, the inspecting, the imaging, and the analyzing, until the one or more particles is removed.

5. The method according to claim 4, further comprising:
determining a total time of cleaning for each particle; and
determining a size of each particle.

6. The method according to claim 5, further comprising:
determining the total time of cleaning as the predetermined exposure time associated with the size of each particle.

7. A method of manufacturing a semiconductor device comprising:
cleaning a particle from a surface of a reticle by exposing the surface of the reticle to a plasma wind stream at an oblique angle with respect to a perpendicular plane to the surface of the reticle for a predetermined exposure time to remove the particle from the surface of the reticle;
transferring the reticle to an exposure device for lithography operation; and
projecting a layout pattern of the reticle using ultraviolet radiation onto a photo resist layer on a wafer,
wherein the cleaning of the surface of the reticle comprises:
cleaning a first region of two or more non-overlapping regions on the surface of the reticle in a treatment device by exposing the first region of the two or more non-overlapping regions on the surface of the reticle to the plasma wind stream at the oblique angle for the predetermined exposure time, wherein each non-overlapping region comprises one or more particles; and
repeat the cleaning on a second region of the two or more non-overlapping regions on the surface of the reticle to clean an entire surface of the reticle.

8. The method according to claim 7, further comprising:
directing a gas flow of helium into an ambient plasma generator to generate the plasma wind stream.

9. The method according to claim 8, further comprising:
applying a high intensity electric field to the gas flow of helium inside the ambient plasma generator to generate the plasma wind stream.

10. The method according to claim 9, further comprising:
adjusting a width of an output opening of an output port of the ambient plasma generator to adjust a speed and angle of the plasma wind stream.

11. A semiconductor manufacturing system, comprising:
a controller;
a wafer exchange device having a robotic arm;
a treatment device configured to mount a reticle or a wafer; and
an exposure device,
wherein the controller is configured to:
control the treatment device to clean a particle from a surface of the reticle or the wafer by exposing the surface of the reticle or the wafer to a plasma wind stream at an oblique angle with respect to a perpendicular plane to the surface of the reticle or the wafer for a predetermined exposure time to remove the particle from the surface of the reticle or the wafer; and
control the robotic arm to transfer the reticle or the wafer from the treatment device to the exposure device for lithography processing,
wherein the treatment device further comprises a hinged wall coupled to a wind angle controller at an output opening of an output port of an ambient plasma generator, and
wherein the wind angle controller is configured to rotate the hinged wall to change a direction and speed of the plasma wind stream.

12. The semiconductor manufacturing system according to claim 11, wherein the treatment device further comprises:
a scanning-imaging device, wherein in response to a command from the controller, a stage is configured to move under the scanning-imaging device and the scanning-imaging device is configured to capture an image of the surface of the reticle or the wafer and to transfer the captured image to an analyzer module,
wherein the analyzer module is configured to determine a map of particles on the surface of the wafer or the reticle.

13. The semiconductor manufacturing system according to claim 12, wherein the ambient plasma generator further comprises:
a channel surrounded by a body.

14. The semiconductor manufacturing system according to claim 11, further comprising:
a reticle library.

15. The semiconductor manufacturing system according to claim 11, further comprising:
a scanning-imaging device configured to acquire an image of the surface of the wafer or reticle.

16. The semiconductor manufacturing system of claim 15, wherein the scanning-imaging device is configured to send the acquired image to an analyzer module.

17. The semiconductor manufacturing system of claim 16, wherein the analyzer module is configured to generate a map of particles on the surface of the wafer or reticle and send the map of the particles to the treatment device.

18. The semiconductor manufacturing system of claim 17, wherein the treatment device is configured to consecutively remove each one of the particles by the plasma wind stream.

19. The semiconductor manufacturing system according to claim 13, wherein the ambient plasma generator further comprises:
positive and negative electrodes in the body and attached to or included in a wall of the channel, wherein the positive and negative electrodes are configured to generate a high-intensity electric field inside the channel to produce plasma in gas flow that passes through the channel.

20. The semiconductor manufacturing system according to claim 14, wherein prior to directing the plasma wind stream to the surface of the reticle, the controller is configured to send a command to the wafer exchange device to retrieve the reticle from the reticle library and to transfer the reticle to the treatment device.

* * * * *